United States Patent [19]

Lindsey et al.

[11] Patent Number: 4,791,646
[45] Date of Patent: Dec. 13, 1988

[54] METHOD FOR TAILORING THE TWO-DIMENSIONAL SPATIAL GAIN DISTRIBUTION IN OPTOELECTRONIC DEVICES AND ITS APPLICATION TO TAILORED GAIN BROAD AREA SEMICONDUCTOR LASERS CAPABLE OF HIGH POWER OPERATION WITH VERY NARROW SINGLE LOBED FARFIELD PATTERNS

[75] Inventors: Christopher P. Lindsey, Pasadena; Amnon Yariv, San Marino, both of Calif.

[73] Assignee: California Institute of Technology, Pasadena, Calif.

[21] Appl. No.: 129,375

[22] Filed: Nov. 23, 1987

Related U.S. Application Data

[63] Continuation of Ser. No. 761,184, Jul. 31, 1985, abandoned.

[51] Int. Cl.[4] .............................................. H01S 3/19
[52] U.S. Cl. ...................................... 372/44; 372/45; 372/46
[58] Field of Search ........................... 372/44, 45, 46

[56] References Cited

U.S. PATENT DOCUMENTS 4,594,719 6/1986 Ackley .................................. 372/45

FOREIGN PATENT DOCUMENTS 0027088 2/1982 Japan .................................... 372/44

OTHER PUBLICATIONS

C. P. Lindsey, E. Kapon, J. Katz, S. Margalit and A. Yariv, "Single Contact Tailored Gain Phased Array of Semiconductor Lasers," Appl. Phys. Lett. 45(7), Oct. 1, 1984, pp. 722–724.

D. E. Ackley, J. K. Butler and M. Ettenberg, "Phase-Locked Injection Laser Arrays with Variable Stripe Spacing," IEEE Journal of Quantum Electronics, vol. QE-22, No. 12, Dec. 1986, pp. 2204–2212.

D. E. Ackley, "Phase-Locked Injection Laser Arrays with Non-Uniform Stripe Spacing," Ninth IEEE International Semiconductor Laser Conference, Aug. 7–10, 1984, Rio de Janeiro, Brazil, pp. 88–89.

Primary Examiner—William L. Sikes
Assistant Examiner—Georgia Y. Epps

[57] ABSTRACT

A method of providing an optoelectronic device is disclosed in which the spatial gain profile within the device is tailored by a predetermined pattern of injecting and noninjecting contacts over the surface of the device with variation in the fractional surface coverage per unit area of injecting to noninjecting contact, thereby providing nearly arbitrary two-dimensional spatial gain profile within the optoelectronic device. A tailored gain broad area semiconductor laser fabricated by this method is capable of high power operation with very narrow, single lobed farfield patterns.

4 Claims, 12 Drawing Sheets

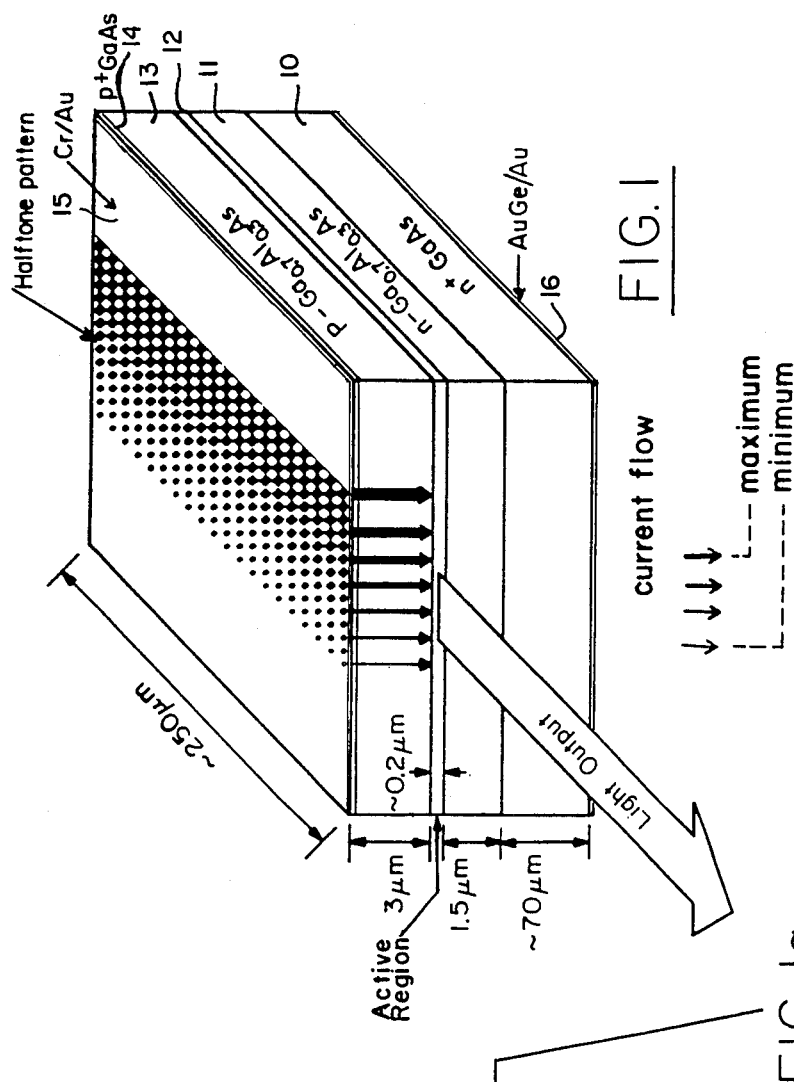
FIG. I
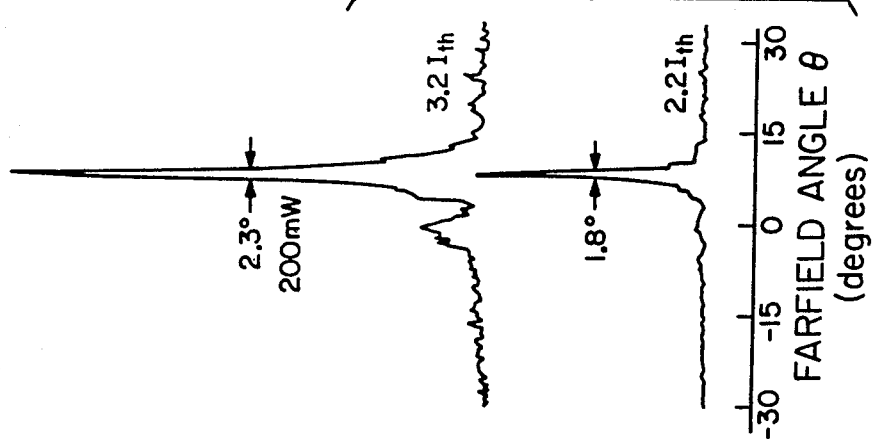
FIG. Ia

FARFIELD ANGLE θ (degrees)

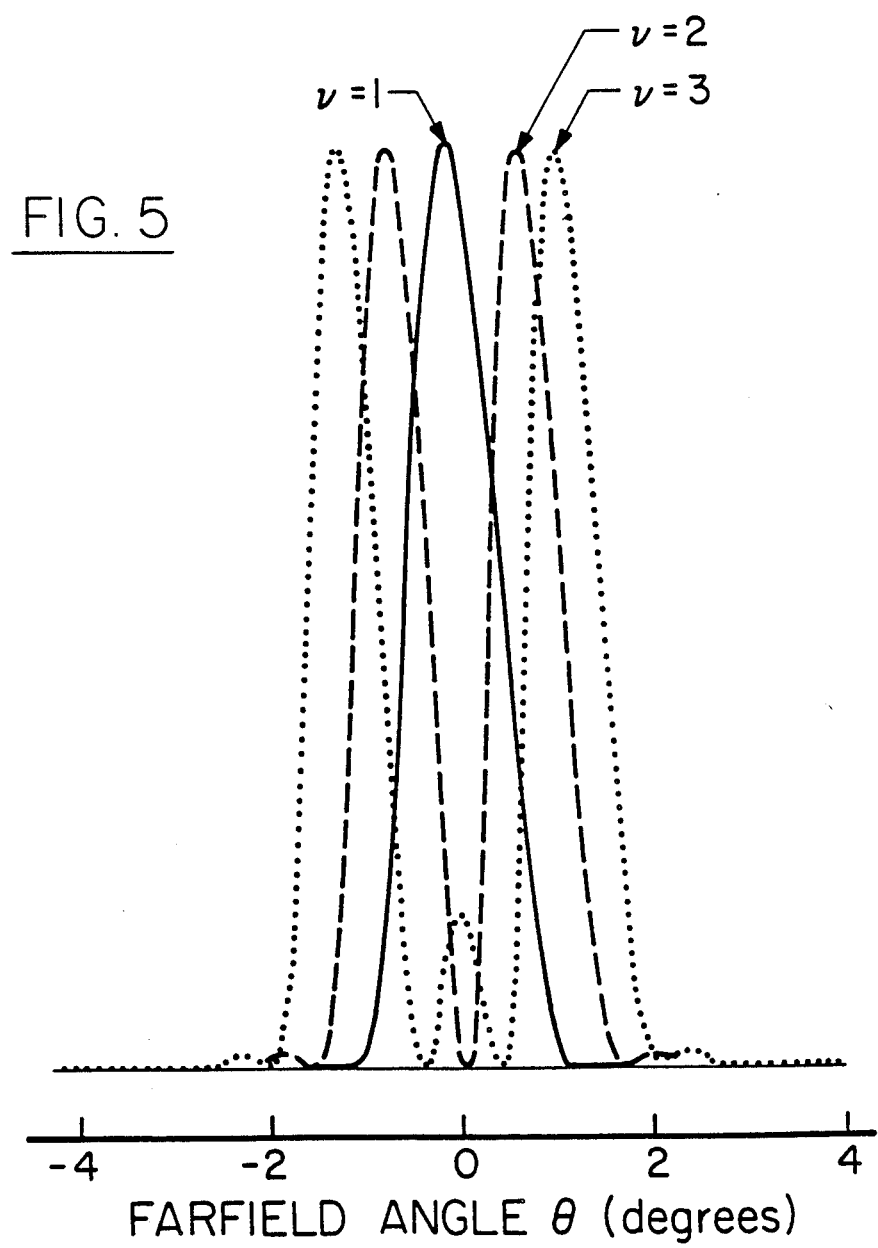

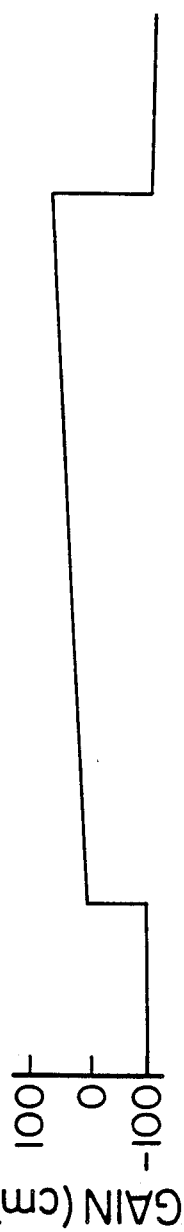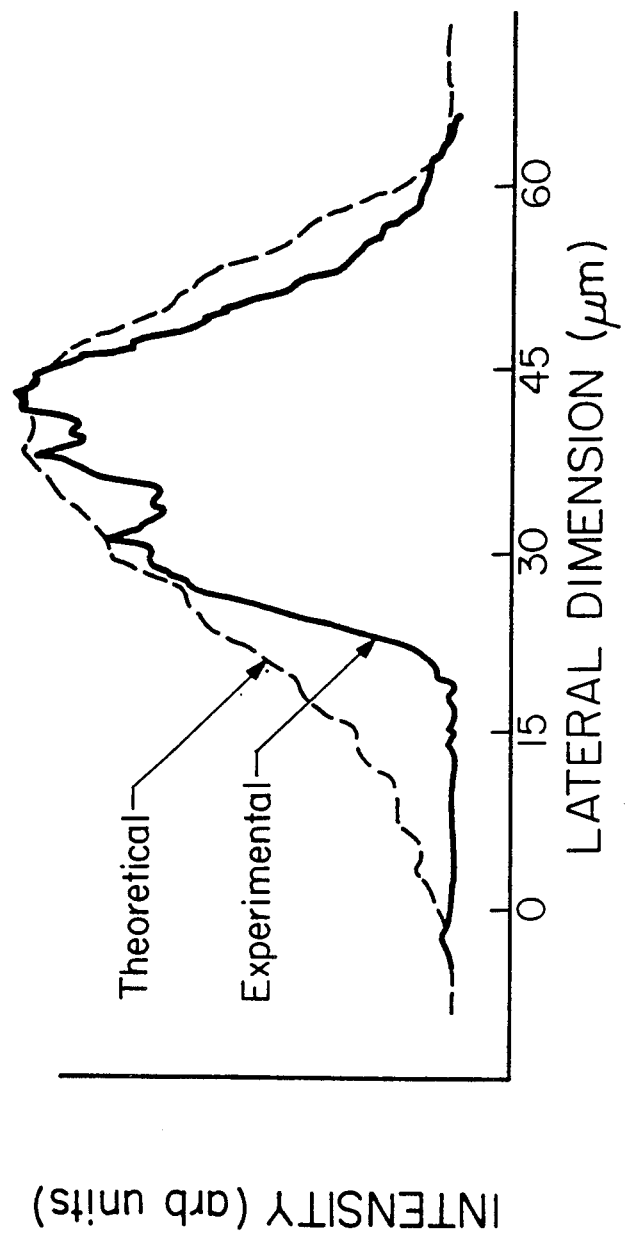
FIG. 9a
FIG. 9b

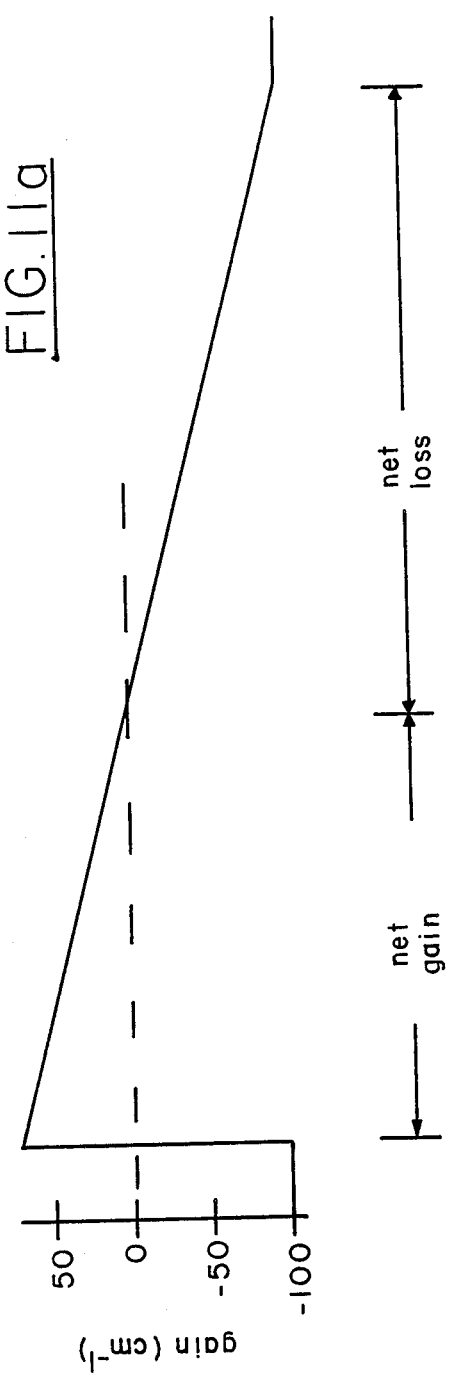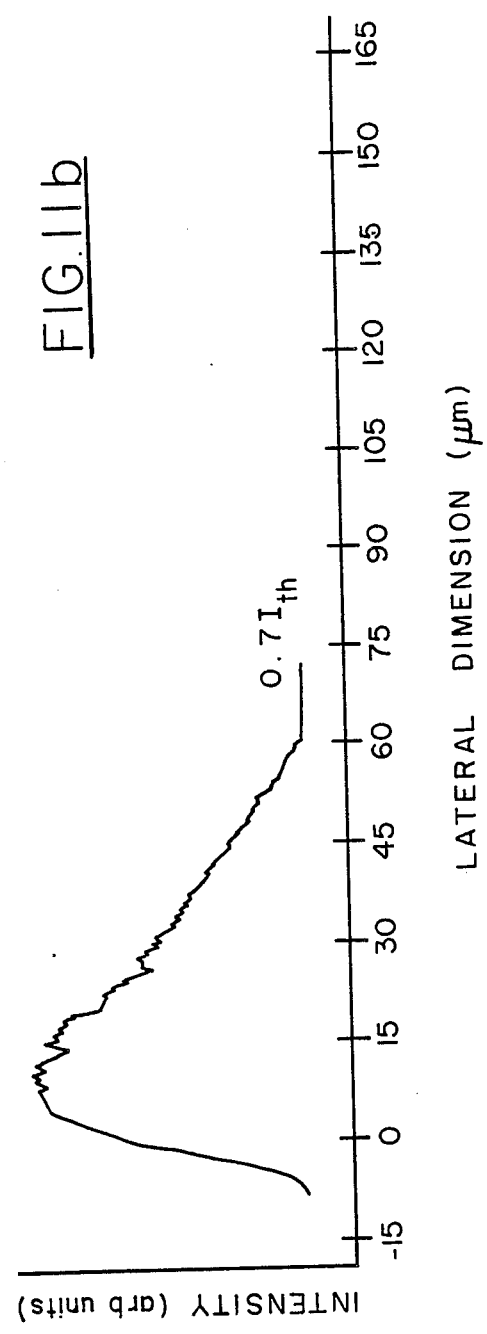

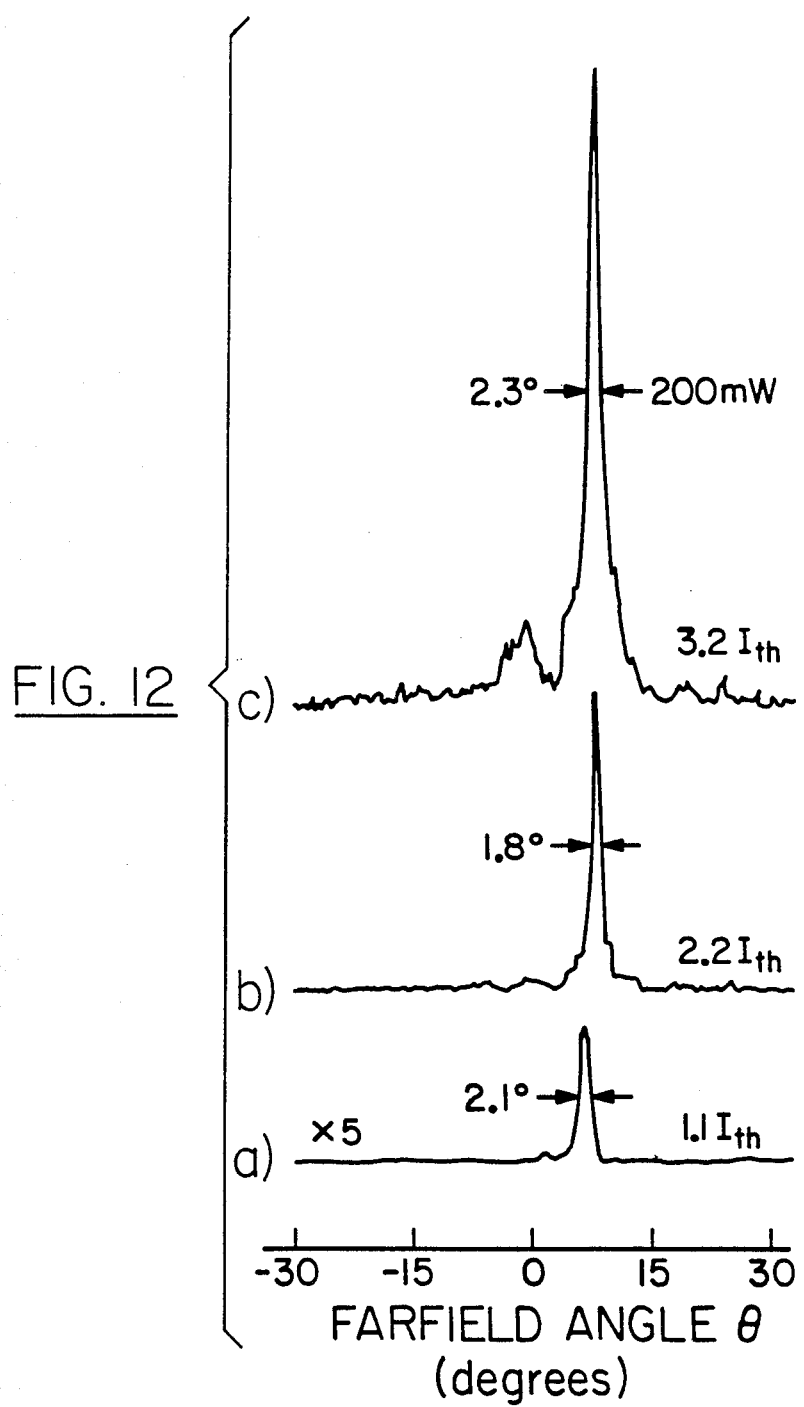

METHOD FOR TAILORING THE TWO-DIMENSIONAL SPATIAL GAIN DISTRIBUTION IN OPTOELECTRONIC DEVICES AND ITS APPLICATION TO TAILORED GAIN BROAD AREA SEMICONDUCTOR LASERS CAPABLE OF HIGH POWER OPERATION WITH VERY NARROW SINGLE LOBED FARFIELD PATTERNS

ORIGIN OF INVENTION

The invention described herein was made in the performance of work under contracts with the Office of Naval Research and the National Science Foundation, and is subject to the provisions of Public Law 96-517 (35 USC 202) in which the Contractor has elected to retain title.

This application is a continuation of application Ser. No. 761,184 filed 7/31/85, now abandoned.

BACKGROUND OF INVENTION

This invention relates to optoelectronic devices, and more particularly to a method of achieving nearly arbitrary two-dimensional spatial gain profiles within an optoelectronic device and its specific application to a semiconductor laser, to provide a new type of laser, the tailored gain broad area semiconductor laser, which is capable of high power operation with very narrow, single lobed farfield patterns.

Conventional semiconductor lasers are capable of emiting several tens of milliwatts of optical power into a single beam ten to twenty degrees wide in the junction plane (the lasers described herein have been shown capable of emitting 200 milliwatts of optical power into a single beam only 2½° wide). Considerable effort has gone into finding methods of increasing the power output and decreasing the beamwidth of a semiconductor laser. In principle, one method by which this might be done is to increase the width of the laser in the lateral direction to make a "broad area" laser. (The term "broad area" laser usually refers to a semiconductor diode laser with a width in the lateral direction of greater than about 10 to 15 $\mu$m). Conventional broad area semiconductor lasers have a nearly uniform lateral spatial gain profile. As a direct result of this uniform gain profile, such devices have very wide, poorly characterized, and unstable farfield patterns. These undesirable farfield patterns result from two physical effects.

First, the presence of a nonlinear interaction between the carriers and the optical field in a conventional semiconductor laser with a uniform spatial gain profile produces filaments, so-called because a photomicrograph of an operating device exhibits small areas of enhanced optical intensity with a filamentary structure. This interaction effectively forms a small waveguide 3 to 12 $\mu$m wide within the larger waveguide defined by the entire broad area laser. As a result of translational invariance within a conventional uniform gain broad area laser, the filaments become unstable and move about randomly. The complicated motions and interactions of the many filaments in a conventional uniform gain broad area laser are one cause of the poor beam quality characteristic of these devices. Therefore, if a laser's power output is to be increased by increasing the laser's width, some method of stabilizing the filaments must be found. In conventional semiconductor lasers, this is usually achieved by making the laser's width narrow enough so that only one filament can form.

A second problem which must be overcome comes about because the waveguide in a broad area laser can support many optical modes. In a conventional uniform gain broad area laser, only the fundamental mode will have a predominately single-lobed farfield pattern. Thus, if the laser's farfield pattern is to be single-lobed and diffraction limited (i.e., as narrow as possible), the fundamental mode must be the only lasing mode. All other modes must be discriminated against. This is not possible in a conventional broad area laser with a uniform spatial gain profile because many of the undesirable higher order modes have modal gains very close to that of the fundamental, and will therefore lase along with the fundamental. Without some means of tailoring the spatial gain profile so as to flavor the fundamental, the only method of achieving single lobed farfield operation is to make the laser narrow enough so that the waveguide supports only the fundamental mode, making it the sole lasing mode.

Thus, the twin problems of filamentation and lateral mode control may be solved by the simple expedient of limiting the width of the laser, typically 5 to 10 $\mu$m. However, limiting the width of the laser stripe also limits the laser's maximum power output and minimum beamwidth. New semiconductor laser designs which achieve high power operation by increasing the laser's width must solve both the filamentation and lateral mode control problems. This cannot be done without creating a nonuniform spatial gain distribution within the laser—i.e., by employing some form of gain tailoring.

When compared with the flexibility inherent in the halftone process for achieving two-dimensional gain tailoring, the prior art of gain tailoring is very primitive, depending critically on material parameters which cannot be widely varied, or in laser array structures offering at best only crude one-dimensional control (C. P. Lindsey, E. Kapon, J. Katz, S. Margalit, and A. Yariv, "Single Contact Tailored Gain Phased Array of Semiconductor Lasers", Appl. Phys. Lett" 45(7), 1984, pp. 722–724).

OBJECTS AND SUMMARY OF THE INVENTION

An object of this invention is to provide a method for creating a nearly arbitrary two-dimensional carrier and hence spatial optical gain profile via nonuniform current injection in an optoelectronic device. A further object is to provide a method for producing a new type of semiconductor laser, the tailored gain broad area semiconductor laser, which is capable of much higher power operation with a narrower single lobed farfield pattern than conventional semiconductor lasers.

In accordance with the present invention, the method for achieving gain tailoring is to produce a pattern of geometrical shapes which vary in surface area or spacing between them so as to vary the fractional coverage per unit area of injecting contact relative to noninjecting contact over the surface of an optoelectronic device. The method is reminiscent of the halftone process used by graphics artists to reproduce a photograph on the printed page, and will therefore be referred to herein as the "halftone" process. Just as the halftone process used by the graphics artist allows nearly arbitrary two-dimensional images with many shades of grey to be created using only black ink on white paper, the halftone process as applied to optoelectronic devices allows nearly arbitrary two-dimensional spatial gain distributions to be created within an optoelectronic device using contacts which either fully inject or fully block the flow of current into the device.

The tailored gain broad area laser is so designed that the fundamental lateral mode is selected and other lateral modes are substantially suppressed to create a non-uniform lateral spatial gain profile that favors the fundamental lateral optical waveguide mode so that a narrow, single-lobed farfield pattern is obtained. The expected widespread utility of the tailored gain broad area laser results from the extreme simplicity of its fabrication procedure, and the fact that it is capable of emitting substantially higher optical power into a much narrower beam than conventional semiconductor lasers.

Although reference is made herein to broad area lasers, it will be readily appreciated that the techniques used for achieving gain tailoring by varying the fractional coverage per unit area of injecting contact relative to that of noninjecting contact over the surface of the laser may have application to other optoelectronic devices in a strictly analogous manner. Consequently, as claimed in its broadest aspects, the technique is to be interpreted as applying to all optoelectronic devices in which the current flow is tailored in a predetermined manner by varying the fractional coverage per unit area of injecting contact relative to noninjecting contact over the surface of the device according to any linear or nonlinear pattern, either one or two dimensional.

The novel features which are considered characteristic of this invention are set forth with particularity in the appended claims. The invention will best be understood from the following description when read in conection with the accompanying drawings.

DEFINITION OF TERMS

The term gain tailoring and tailored gain refer to any method of achieving intermediate values of carrier concentration or optical gain between the maximum and minimum possible values within an optoelectronic device which are obtainable from a broad expanse of injecting or noninjecting contact respectively on the surface of the device according to some predetermined spatial gain or carrier concentration profile.

The term halftone process for achieving gain tailoring refers to any method of achieving gain tailoring in the active region(s) of an optoelectronic device by varying the fractional coverage per unit area of injecting to noninjecting contact over the surface of the device.

The term injecting contact refers to any method of electrically creating carriers within the optoelectronic device's active region(s). In the ideal case of complete injection, all the curent is injected into the active region(s) of the optoelectronic device.

The term noninjecting contact refers to any method of injecting less current into the active region(s) than is provided by an injecting contact. In the ideal case, the current is completely blocked (zero injection, blocking contact).

The term broad area laser refers to a semiconductor diode which supports more than one filament or more than one lateral optical waveguide mode, and which usually has a width in the lateral direction of greater than about 10 $\mu$m.

BRIEF DESCRIPTION OF THE DRAWINGS

FIG. 1 shows a perspective view of an asymmetric linear tailored gain broad area laser ~60 $\mu$m wide, and FIG. 1a shows its farfield pattern at 2.2 and 3.2$I_{th}$. Note the high power operation very a regular, very narrow single lobed farfield pattern ~2° wide.

FIG. 5 shows the theoretical intensity farfield patterns correspondng to the waveguide of FIGS. 4a and 4b. Note that only the fundamental $\nu=1$ mode has a single lobed farfield pattern. All other modes of a uniform gain waveguide have multilobed farfield patterns.

FIG. 9a shows the waveguide model for a 60 $\mu$m wide asymmetric tailored gain broad area laser in which the fractional coverage per unit area of p+GaAs varies from ~75% on the low gain side of the laser to ~90% on the high gain side. FIG. 9b shows the experimental (solid line) and theoretical (dashed line) nearfield pattern at $1.05I_{th}$.

FIG. 11a shows the waveguide model for an asymmetric tailored gain broad area laser in which the fractional coverage per unit area of p+GaAs varies from zero on the low gain side of the laser to ~90% on the high gain side over a lateral dimension of ~160 μm. The spontaneous emission pattern below threshold shown in FIG. 11b makes visible the strongly asymmetric, nonuniform spatial gain profile.

FIG. 12 shows in graphs a, b and c the experimental intensity farfield patterns at several current levels 1.1, 2.2 and $3.2I_{th}$ of the tailored gain broad area laser of FIGS. 1 & 11. The beamwidth was 1.8° at $2.2I_{th}$, and that, as expected from consideration of FIG. 7, at higher powers the beam width broadens slightly, emitting 200 milliwatts of optical power per mirror into a single beam only 2.3° wide at $3.2I_{th}$.

DESCRIPTION OF PREFERRED EMBODIMENTS

Figure 2:
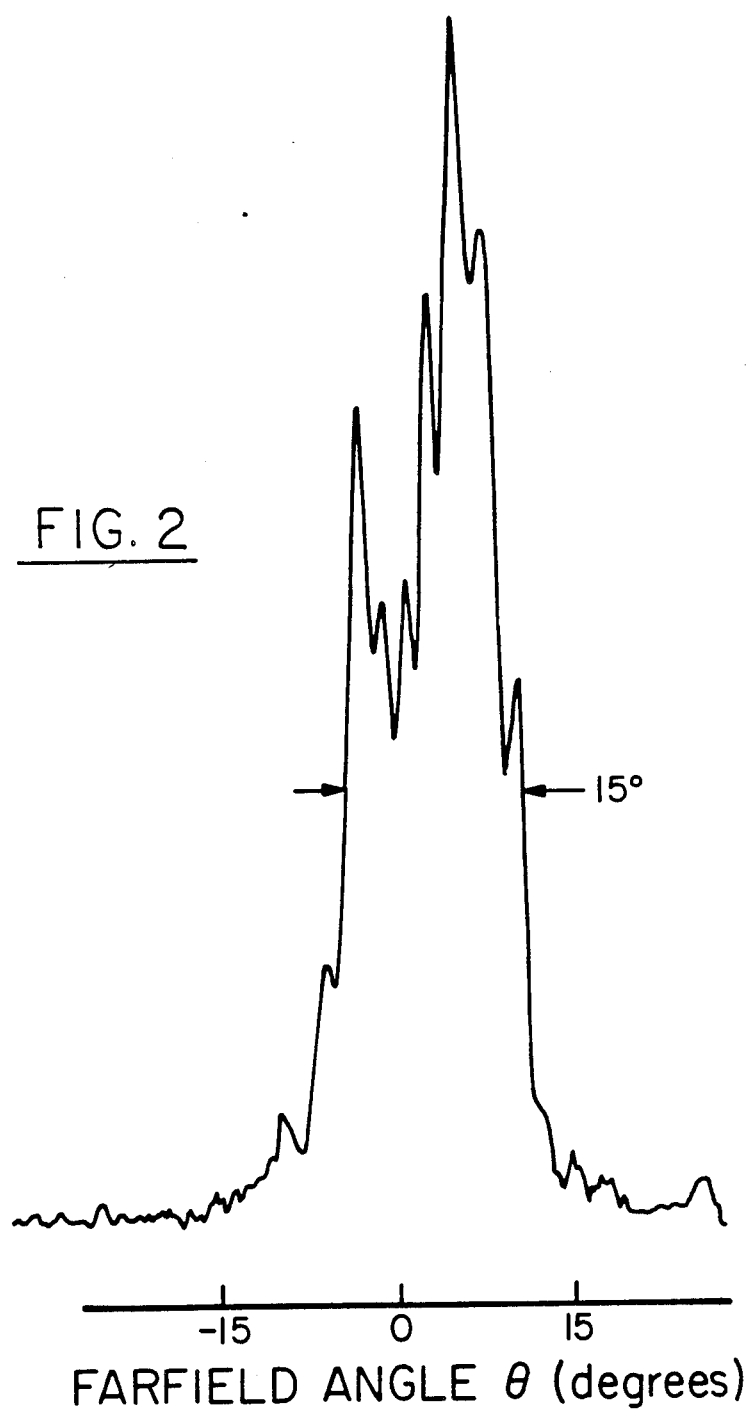
FIG. 2 shows a typical experimental intensity farfield pattern of a uniform gain broad area laser 60 $\mu$m wide. Note that the light intensity within the beam is very irregular and that the beam width is much wider than the diffraction limit of ~2°.

The present invention will now be described as applied to an otherwise standard broad area semiconductor laser. The preferred method used to provide the tailored gain broad area laser is extraordinarily simple, requiring only one step photolithography, a noncritical wet chemical etch, and no proton implantation, regrowth or curved mirrors. It is thus very well suited to large scale processing techniques.

With reference to FIG. 1, the tailored gain broad area laser made by the halftone process consists of four layers which are grown on an n+GaAs substrate 10 (Si doped, $2 \times 10^{18}$ cm$^{-3}$) using conventional molecular beam epitaxy (MBE). The composition and thickness of the layers are as follows: nGa$_{0.7}$Al$_{0.3}$As lower cladding layer 11 (1.5 μm thick), Si doped, $5 \times 10^{17}$ cm$^{-3}$; undoped active region 12 consisting of four layer multiple quantum well (MQW) of 200 Å of GaAs separated by 200 Å of Ga$_{0.7}$Al$_{0.3}$As; pGa$_{0.7}$Al$_{0.3}$As upper cladding layer 13 (3.0 μm thick), Be doped, $5 \times 10^{17}$ cm$^{-3}$; p+GaAs cap layer 14, (0.2 μm thick), Be doped, $5 \times 10^{18}$ cm$^{-3}$. Neither the composition nor thickness of the layers is critical, although it is desirable to enhance carrier diffusion between the cap layer 14 and the active region 12 by increasing the thickness of the upper cladding layer 13 so that the effects of the discrete areas of injecting contact are smeared out by carrier diffusion.

After growth, selected portions of the 0.2 μm p+GaAs cap layer 14 are etched away using H$_2$SO$_4$:H$_2$O$_2$:H$_2$O::1:8:40 according to a halftone pattern of dots (or other shapes such as triangles, diamonds, squares, etc.) which have been formed on a photoresist mask. The purpose of the pattern is to vary the fractional coverage per unit area of unetched p+GaAs mesas 14 (which with the metal 15 form the injecting contact, indicated by the black dots) relative to the etched pGa$_{0.7}$Al$_{0.3}$As upper cladding layer (which with the metal 15 forms the Schottky barrier, noninjecting contact indicated by the remaining white area) across the surface of the laser. In the method's application to the asymmetric tailored gain broad area laser, the fractional coverage per unit area of injecting contact increases from a minimum to a maximum as shown in FIG. 1. It should also be noted that if the pattern on the photoresist mask used for this step consisted only of a black, wide stripe surrounded by white areas instead of the halftone pattern just described, a conventional uniform gain broad area laser would be produced.

After etching, a single contact 15 of Cr/Au is deposited over the entire surface, contacting both the p+GaAs mesas as well as the newly exposed pGaAlAs surface. This forms the p contact. The devices are then lapped to ~70 μm, AuGe/Au 16 is deposited to form the n contact, and both contacts are annealed at 380° C. for 20 seconds in an H$_2$ atmosphere. Devices are then cleaved into bars ~250 μm long and tested under low duty cycle pulsed conditions.

FIG. 1a also shows the tailored gain broad area laser's farfield pattern at two power levels. 200 milliwats of optical power per mirror is emitted into $2\frac{1}{2}°$ at $3.2I_{th}$. This is a substantially higher amount of power emitted into a much narrower beam than is available from conventional semiconductor lasers. The farfield patterns of a tailored gain broad area laser in FIG. 1a should be compared with the 15° beamwidth of a typical conventional uniform gain broad area laser with approximately the same lateral dimension in FIG. 2, where it may be seen that the tailored gain broad area laser has a much narrower farfield pattern than an otherwise similar uniform gain broad area laser. Thus, FIG. 1a illustrates the utility of the halftone process for achieving gain tailoring in an optoelectronic device, in this case a semiconductor laser.

As mentioned earlier, this method of achieving gain tailoring in a semiconductor laser is similar to the halftone process used by graphics artists to reproduce a photograph on the printed page. The process is extraordinarily versitile. Consider, for example, the nearly infinite visual patterns which have been created using the halftone process by the graphics arts industry. Or, consider the many patterns which can be created on a typed page by varying the character density (size, shape, and/or spacing). Any one of these myriad images could equally well become the two-dimensional spatial gain profile in a semiconductor laser by merely photoreducing the pattern to semiconductor laser size dimensions and using the resulting mask for the etching step described above. Use of the halftone process to control the two-dimensional spatial gain profiles therefore offers an entirely new degree of freedom to the designer of semiconductor lasers.

Figure 3B:
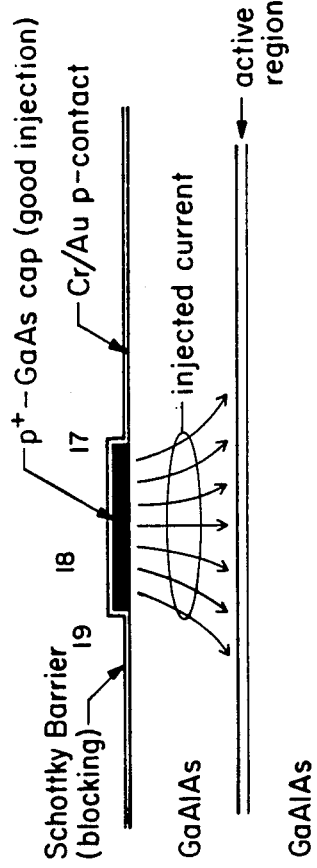
FIG. 3b shows the details of Schottky isolation, in which current is injected at the metal to p+GaAs interface and blocked at the metal to pGaAlAs interface. A conventional uniform gain broad area laser is created by making the width of the p+GaAs stripe 14 greater than about 15 $\mu$m. The effect of current spreading in the upper cladding layer is indicated by the curved arrows.
Figure 3A:
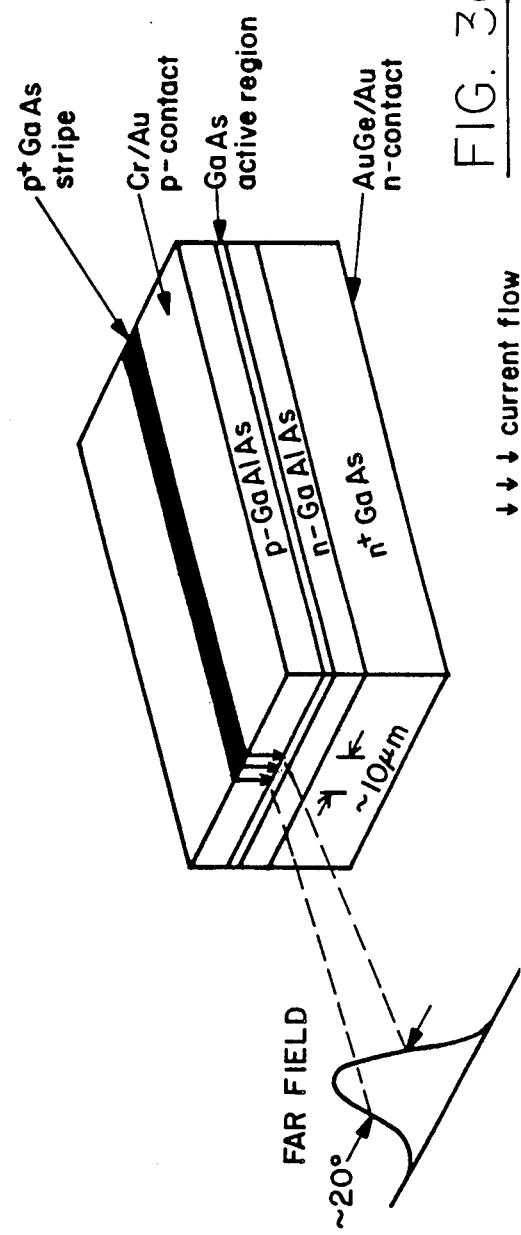
FIG. 3a shows a perspective view of a Schottky isolated stripe laser.

To better understand the utility of gain tailoring in a semiconductor laser, first consider the operation of a conventional semiconductor laser. FIG. 3a shows a cross sectional view of one type of such a laser, a Schottky isolated stripe laser. FIG. 3b shows the details of Schottky isolation, in which current is injected at the metal 17 to p+GaAs 18 interface and blocked at the metal 17 to pGaAlAs 19 interface. It is important to note that current is either injected or almost completely blocked. There is no widely known method of injecting intermediate amounts of current. (The analogy between this problem in semiconductor lasers and the corresponding problem of printing shades of grey using only black ink on white paper is obvious, and leads directly to the halftone method's application to semiconductor lasers.) The effect of current spreading in the upper cladding layer is indicated by the curved arrows. The width of the laser's optical waveguide is determined by the width of the p+GaAs injecting stripe 18. A conventional uniform gain broad area laser results when the stripe width is greater than about 15 μm.

Figure 4A:
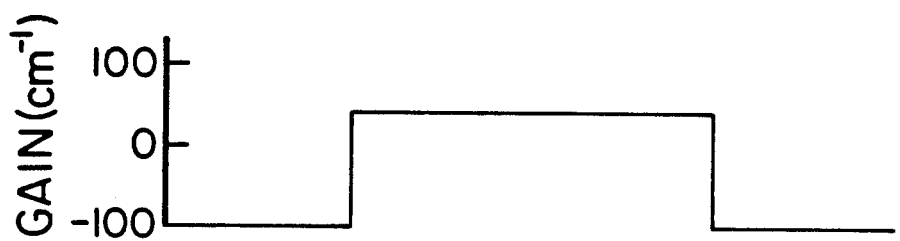
FIG. 4a shows the spatial gain distribution within a uniform gain broad area laser 60 $\mu$m wide.

To analyze the optical properties of conventional uniform gain broad area lasers, the simple waveguide model of FIG. 4a will be used. There are four parameters entering into the model. The width of the waveguide is fixed by the photolithography. The low gain value of $-100$ cm$^{-1}$ at the edges of the laser is fixed by the absorbtion of the unpumped GaAs active region. The (uniform) gain in the pumped part of the laser under the injecting stripe is fixed by the requirement that at threshold the modal gain of the lasing mode must be equal to the mirror losses, which were estimated to be approximately 40 cm$^{-1}$. (In a uniform gain broad area laser, this means that the modal gain of the fundamental mode will be very close to that of the peak gain in the pumped part of the laser). The effect of the carriers on the real part of the refractive index was included by using an antiguiding factor of 3.0. The eigenmodes and unsaturated modal gains were obtained by numerical solutions of Maxwell's equations.

Figure 4B:
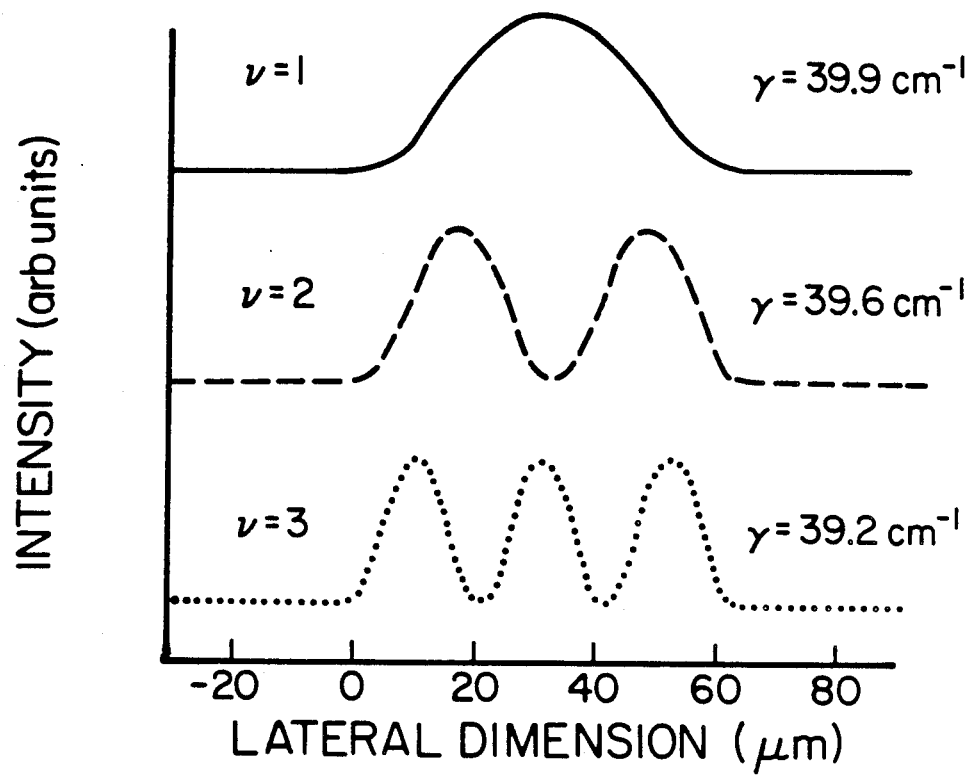
FIG. 4b shows the intensity nearfield patterns of the three lowest order optical modes of the waveguide of FIG. 4a. Note that the modal gains $\gamma$ of the first two higher order lateral modes $\nu=2$ and $\nu=3$ are within 1 cm$^{-1}$ of that of the fundamental $\nu=1$ mode. This poor mode discrimination between the fundamental and the higher order modes leads to the multilobed farfield patterns commonly observed in these devices.

FIG. 4b shows the theoretical intensity nearfield patterns for a uniform gain broad area laser 60 μm wide. The modal gains $\gamma$ of the first two higher order lateral modes $\nu=2$ and $\nu=3$ are within 1 cm$^{-1}$ of that of the fundamental $\nu=1$ mode. This poor mode discrimination between the fundamental and the higher order modes leads to the multilobed farfield patterns commonly observed in these devices. This is illustrated in FIG. 5, which shows the theoretical intensity farfield patterns corresponding to the waveguide of FIGS. 4a and 4b. Note that only the fundamental $\nu=1$ mode has a single lobed farfield pattern. All other modes of a uniform broad area waveguide are multilobed. A typical exprimentally observed intensity farfield pattern of a uniform gain broad area laser 60 μm wide is shown in FIG. 2. Note that the light intensity within the beam is very irregular and much wider than the diffraction limit of $\sim 2°$. This illustrates the deficiency of the conventional uniform gain broad area laser structure.

Figure 6A:
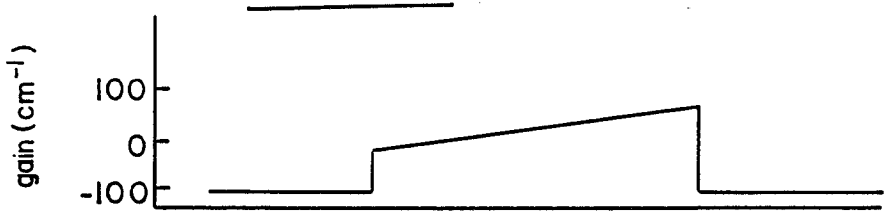
FIG. 6a shows the waveguide model.

Consider now the model for a nonuniform tailored gain broad area laser. This model, which is illustrated in FIG. 6a, is similar to the model of FIGS. 4a and 4b, except that the peak gain value at the right edge of the laser is fixed by the requirement that at threshold the modal gain of the lasing mode must equal the mirror losses, which means that the peak gain at the right edge of the laser will now be somewhat higher than the modal gain. The gain at the opposite side of the laser was set just above transparency (zero cm$^{-1}$).

Figure 6B:
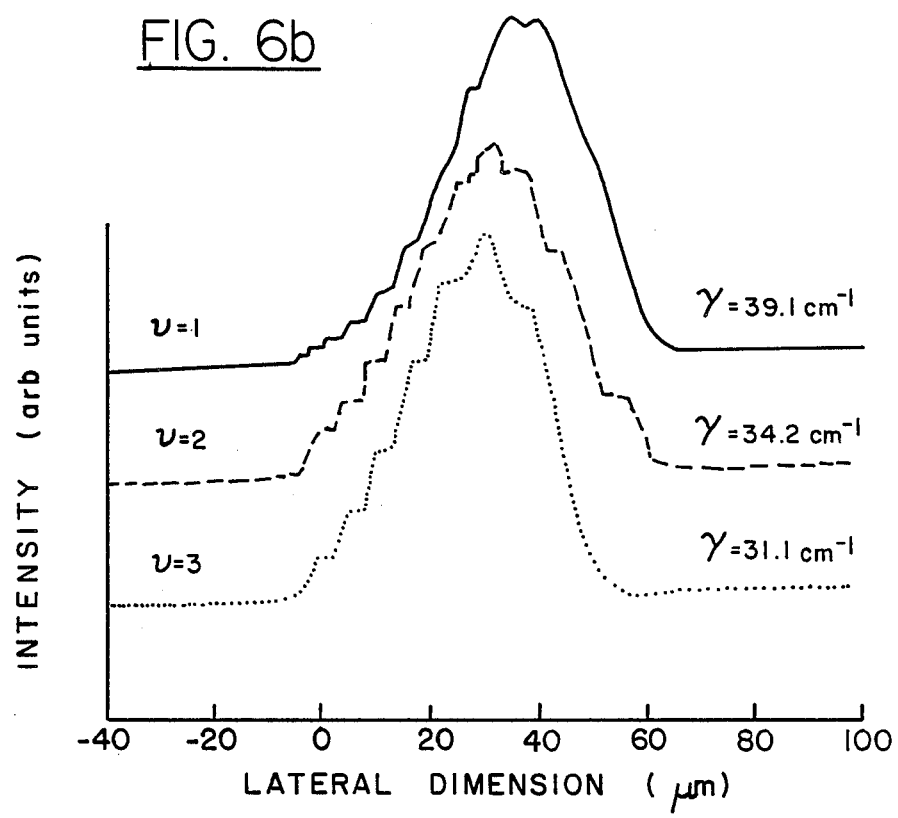
FIG. 6b shows the theoretical intensity nearfield patterns for the three lowest order optical modes of an asymmetric tailored gain broad area laser 60 $\mu$m wide. Note the excellent mode discrimination in favor of the fundamental mode which comes about because the fundamental mode has a modal gain ~5 cm$^{-1}$ greater than the higher order $\nu=2$ and ~8 cm$^{-1}$ greater than that of the $\nu=3$ lateral mode.

FIG. 6b shows the theoretical intensity nearfield patterns for an asymmetric linear tailored gain broad area laser 60 μm wide. The theoretical modal gains of the three lowest order modes of this asymmetric tailored gain broad area laser are compared in Table I with those of a conventional, otherwise similar, uniform gain broad area laser.

TABLE I

Comparison of the modal gains of the three lowest order modes of a 60 μm wide uniform gain and asymmetric tailored gain broad area laser

| $\nu$ | uniform gain (cm$^{-1}$) | tailored gain (cm$^{-1}$) |
|---|---|---|
| 1 | 39.9 | 39.1 |
| 2 | 39.6 | 34.2 |
| 3 | 39.2 | 31.1 |

The effect of the nonuniform gain distribution is to provide excellent mode discrimination in favor of the fundamental mode. This comes about because the higher order modes in a tailored gain broad area laser have modal gains which are $\sim 5$ cm$^{-1}$ and $\sim 8$ cm$^{-1}$ less than that of the fundamental, thus making it difficult for these modes to reach threshold. This large mode descrimination is to be compared with the conventional 60 μm wide uniform gain broad area laser of FIGS. 2-4, in which the higher order modal gains differ from that of the fundamental by less than 1 cm$^{-1}$.

Figure 7:
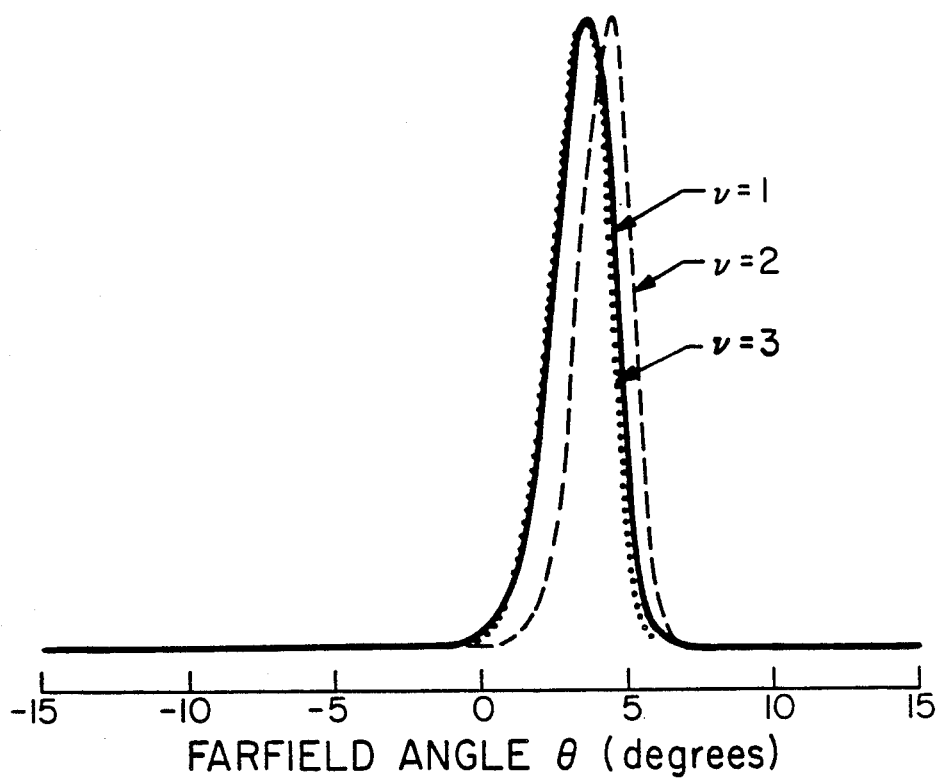
FIG. 7 shows the theoretical intensity farfield patterns corresponding to the waveguide of FIG. 6a. Note that unlike the uniform gain waveguide, the farfield patterns of the higher order modes in an asymmetric tailored gain waveguide are all single lobed and only slightly displaced from those of the fundamental. As a direct result, the beam will broaden slightly at high power; additional sidelobes will appear only at very high power.

A further difference between a uniform and nonuniform tailored gain broad area laser is illustrated in FIG. 7, which shows the theoretical intensity farfield patterns corresponding to the waveguide of FIG. 6. Note that unlike the uniform gain waveguide, the farfield patterns of the higher order modes in an asymmetric tailored gain induced waveguide are all single lobed and only slightly displaced from those of the fundamental. This has an important consequence for high power operation. In any laser which is operated well above threshold, gain saturation effects cause the excitation of several lateral modes. In a conventional uniform gain broad area laser, a single lobed farfield is exhibited only by the fundamental mode; the excitation of higher order modes results in multilobed farfield patterns similar to those of FIGS. 2 and 5. In the asymmetric tailored gain guided structure of FIG. 6a and b, the modes with the highest modal gains are characterized by single lobed farfields with similar radiation patterns. This is a direct result of the lack of left-right inversion symmetry in the laser and the complex valued electric field due to gain-guiding. (C. P. Lindsey, E. Kapon, J. Katz, S. Margalit, and A. Yariv, "Single Contact Tailored Gain Phased Array of Semiconductor Lasers", Appl. Phys. Lett" 45(7), 1984, pp. 722-724). As the example of FIG. 7 shows, when gain saturation at high power causes the excitation of several modes, the farfield pattern will remain single lobed, albeit with a somewhat larger beamwidth. This theoretical prediction has been confirmed experimentally, and is a useful characteristic of asymmetric tailored gain lasers.

Tailored gain broad area lasers may be implemented in a simple manner via the halftone process in which the fractional coverage per unit area of the injecting metal to p+GaAs ohmic contact relative to the noninjecting pGaAlAs Schottky blocking contact is varied over the surface of the laser. A perspective view of an asymmetric tailored gain broad area laser in which the gain profile varies from a minimum to a maximum is shown in the upper half of FIG. 1a. (It should be noted that continuity in the physical parameters means that it is not possible to have discontinuity in the gain profile; the preceding sentence is intended merely to describe the predominate effect). As mentioned earlier with reference to FIG. 1, the four layer heterostructure is quite conventional, except that the thickness of the upper cladding layer 13 has been increased to enhance lateral carrier diffusion in the region between the p+GaAs cap layer 14 and the active layer 12. Neither the composition nor thickness of the layers is critical, although it is desirable to enhance carrier diffusion between the surface of the laser 15 and the active region 12 by increasing the thickness of the upper cladding layer 13 so that the effects of the discrete areas of injecting contact are smeared out by carrier diffusion.

Figure 8:
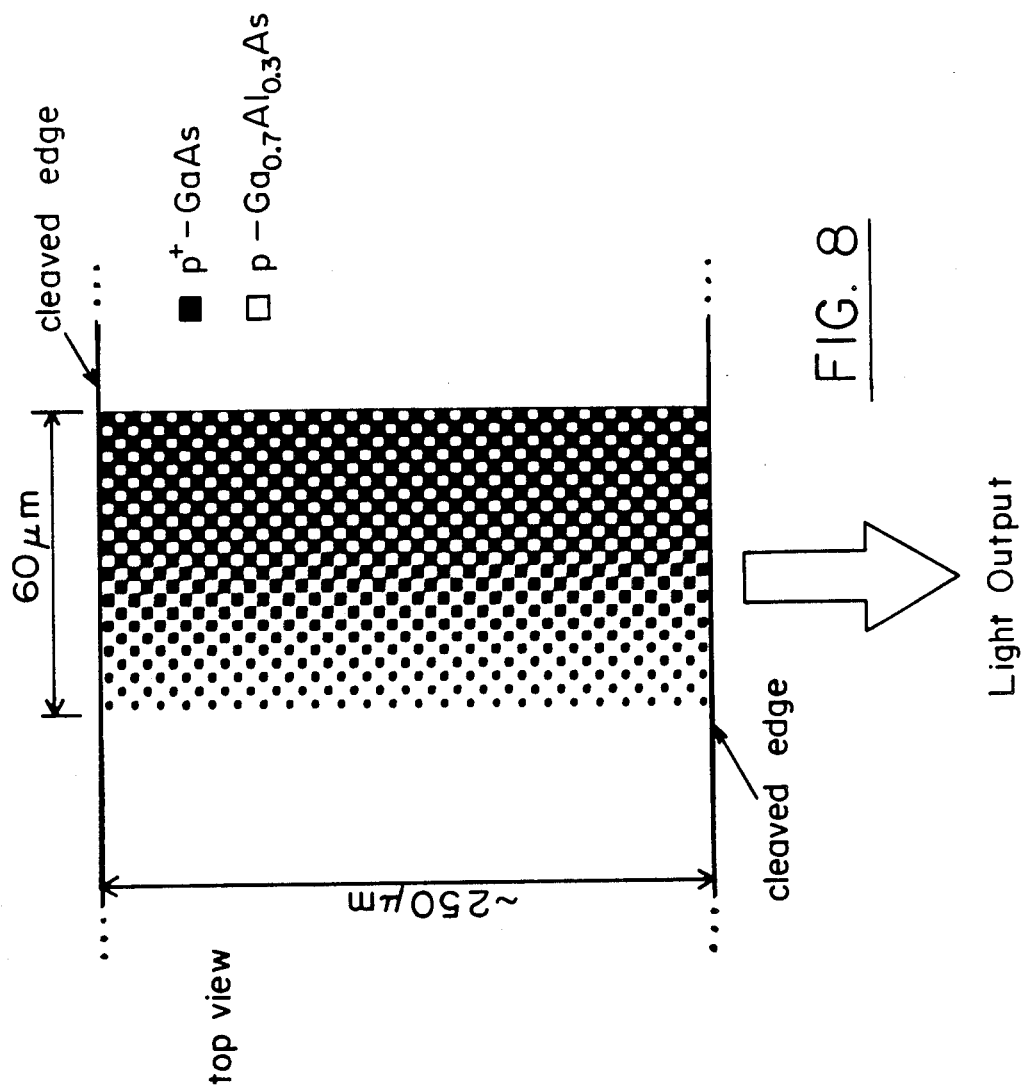
FIG. 8 shows a schematic top view of an asymmetric tailored gain broad area laser in which the size of and variations in the dot size have been exaggerated for clarity. The metal to p+GaAs interface (indicated by the black regions) forms an injecting ohmic contact, while the metal to pGaAlAs interface (indicated by the white regions) forms a Schottky blocking contact. The injection density (and hence gain) thus increases from left to right with the increase of fractional coverage per unit area over the surface by p+GaAs.

The particular halftone pattern which was used to make the tailored gain broad area laser of FIG. 1 is similar to the top view shown in FIG. 8. Recalling that the metal to p+GaAs interface (indicated by the black dots) forms an injecting ohmic contact, while the metal to pGaAlAs contact (indicated by the white areas) forms a Schottky blocking contact. The injection density (and hence gain) thus increases from left to right with the increase of fractional coverage per unit area of the surface by p+GaAs. The enhanced lateral carrier diffusion provided by the thick upper cladding layer 13 smears out the effects of the discrete dots and makes for a smoother, nonuniform spatial gain distribution within the active layer 12. Since the dot size varies linearly across the laser, to a first approximation the gain profile varies linearly as well.

FIG. 9a illustrates the waveguide model used to predict the theoretical nearfield and farfield patterns near threshold of a 60 μm wide asymmetric tailored gain broad area laser in which the fractional coverage per unit area of p+GaAs varies from ~75% on the low gain side of the laser to ~90% on the high gain side. This corresponds roughly to the waveguide model of FIG. 6a.

The theoretical and experimentally observed nearfield patterns at $1.05I_{th}$ of the tailored gain broad area laser of FIG. 8 are superimposed in FIG. 9b, where it may be seen that the experimentally observed nearfield pattern is somewhat narrower than the theoretically expected result. Nevertheless, the lasing area is clearly that of a broad area laser ~40 μm wide. The threshold current of these devices, which were tested under pulsed, low duty cycle conditions, was 400 milliamperes. This was only 20 milliamperes higher than that of a conventional uniform gain broad area laser with the same width.

Figure 10:
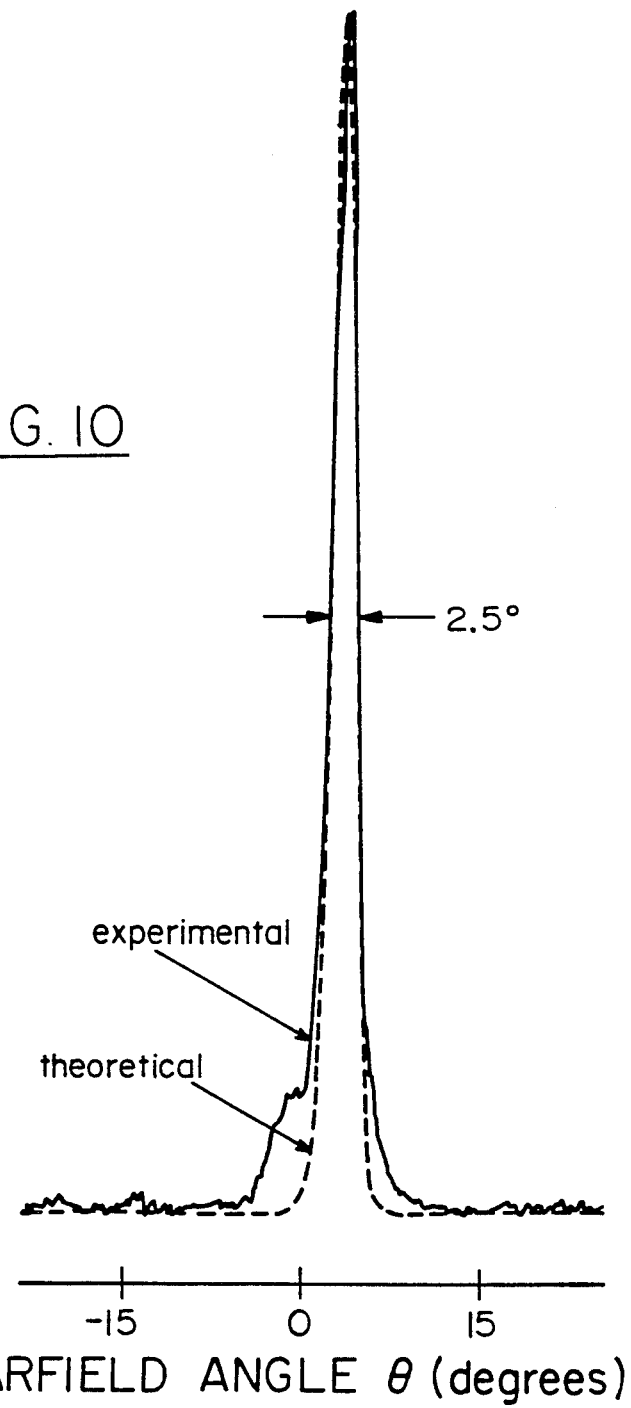
FIG. 10 shows the experimental (solid line) and theoretical (dashed line) intensity farfield pattern of the asymmetric tailored gain broad area laser of FIG. 9b. Note that the $2\frac{1}{2}°$ wide single lobed beam is fully diffraction limited, and the excellent agreement between the experimental and theoretically expected result.

This tailored gain broad area laser's farfield pattern at $1.05I_{th}$ is superimposed on top of the theoretically expected farfield pattern of the fundamental eigenmode in FIG. 10, where it may be seen that the smooth, single lobed farfield pattern is clearly diffraction limited with virtually no power appearing in the sidelobes. This is to be compared with the farfield pattern of a conventional uniform gain broad area laser of FIG. 2 with the same width which is multilobed and ~15° wide. (It should be noted that the symmetric version of this device, in which the gain varies from a minimum to a maximum to a minimum has been demonstrated to be essentially similar to the asymmetric version, except that the beam is directed normal to the mirror facets and that the higher order modes of the symmetric structure do not have single lobed farield patterns).

The single lobed farfield pattern of the device of FIG. 10 did not remain single lobed at higher currents. This occurs because the degree of gain tailoring is very small, only ~15% change in p+GaAs fractional coverage per unit area over 60 μm, or 0.25%/μm. Above threshold, gain saturation reduces the gain in the high gain areas of the laser more than it does in the low gain areas, thus tending to make the gain profile across the width of the laser more like that of a conventional uniform gain broad area laser. This deleterious effect of gain saturation on device performance may be minimized by increasing the gradient in the gain profile.

This is confirmed by the single lobed operation at considerably higher power which is obtained in a tailored gain broad area laser in which the fractional coverage per unit area of p+GaAs varies from zero to ~90% over 160 μm (0.56%/μm, double that of the previous example). FIG. 11a shows the waveguide model of this latter laser. It is similar to the model of FIG. 9a except that the gain increases from $-100$ cm$^{-1}$ to its maximum value of ~70 cm$^{-1}$ over 160 μm. FIG. 11b shows the spontaneous emission pattern below threshold for the laser of FIG. 10a. Below threshold, the spontaneous emission pattern makes visible the strongly asymmetric, nonuniform spatial gain profile. Note that light is emitted only over the high gain regions at the left half of the laser. This occurs because the right half of the laser remains lossy (i.e., it has negative gain) since it does have enough carriers injected into it to reach transparency (zero gain). FIG. 12 in graphs, a, b and c shows the experimental intensity farfield patterns at several progressively higher current levels 1.1, 2.2, and $3.2I_{th}$ for the tailored gain broad area laser of FIG. 11. The beamwidth is 1.8° at $2.2I_{th}$, and that, as expected from consideration of FIG. 7, at higher powers the beam width broadens slightly yet remains single lobed at higher power levels. 200 milliwatts of optical power were emitted per mirror into a single narrow beam only 2.3° wide at $3.2I_{th}$. This is a much higher optical output into a much narrower beam than is available from conventional semiconductor lasers, and thus demonstrates the utility of the halftone process for achieving gain tailoring in semiconductor lasers.

Finally, it should be noted that filaments, with widths which have been shown to be between 3 and 12 μm wide, have farfield patterns between 5 and 20 degrees wide. The diffraction limited farfield pattern 2.5° wide of FIG. 10 indicates that filamentation does not occur in asymmetric tailored gain broad area lasers, in contrast to conventional uniform gain broad area lasers. This result is quite unexpected, and is not yet fully understood.

Although preferred embodiments of the invention have been described and illustrated herein, it is recognized that modifications and equivalents in different structures may readily occur to those skilled in the art of optoelectronics and semiconductor lasers. While application of the halftone process for achieving spatial gain tailoring is made herein only to one particular example of a linear, asymmetric, laterally gain-guided laser with cleaved mirrors and Schottky blocking contacts, it is recognized that the invention may also be used to achieve spatial gain tailoring 1. in any optoelectronic device which employs electrical excitation to create gain or reduce loss within the device's active region such as light emitting diodes, superluminescent diodes, and semiconductor light amplifiers as well as lasers;

2. in a real index guided laser or other optoelectronic device as well as a gain guided laser or other optoelectronic device;

3. in lasers or other optoelectronic device with curved and etched mirrors as well as cleaved mirrors;

4. in lasers or other optoelectronic device with feedback mechanisms without mirrors (such as distributed feedback lasers);

5. in vertical lasers or other optoelectronic devices in which the light is emitted perpendicular to the active region(s);

6. according to schemes other than asymmetric linear in the lateral direction;

7. by varying the fractional coverage per unit area from a minimum to a maximum or from a minimum to a maximum to a minimum again;

8. in the longitudinal as well as the lateral direction;

9. in semiconductor materials other than GaAs and GaAlAs;

10. by using injecting contacts other than metal to $p^+$GaAs and noninjecting contacts other than Schottky metal to pGaAlAs;

11. by other methods of blocking or decreasing current injection into an optoelectronic device's active region, such as (but not limited to) proton implantation, use of an insulating layer such as $SiO_2$, by varying the dopant concentration and type between the surface of the laser and the active region, etc;

What is necessary and sufficient in each structure is to achieve gain tailoring by varying the fractional coverage per unit area of injecting contact relative to noninjecting contact over the surface of the optoelectronic device, or to create a tailored gain broad area laser in which the gain varies from a minimum to a maximum, or from a minimum to a maximum to a minimum again.

What is claimed is:

1. A broad area injection semiconductor laser having a predetermined two-dimensional pattern of injecting and noninjecting contacts over a broad area of said device in which laser the two-dimensional spatial gain profile is tailored over said broad area to conform to a predetermined tailored pattern of varying injection by a predetermined contact pattern of injecting and noninjecting areas over said broad area of said, said contact pattern being achieved by variation in the fractional surface coverage per unit area of injecting to noninjecting contact, thereby achieving said predetermined pattern of two-dimensional spatial gain profile.

2. A broad area injection semiconductor laser as defined in claim 1 wherein said broad area semiconductor laser is comprised of a substrate, said injection contact pattern, and an active region with upper and lower cladding layers, said upper layer being farthest from said substrate, said active region being between said contact pattern and said substrate and having said contact pattern with fractional surface coverage over said upper cladding layer.

3. A broad area injection semiconductor laser as defined in claim 2 wherein said predetermined contact pattern is comprised of a conductive cap layer grown on said upper cladding layer, with parts of said cap layer etched away according to nonconductive areas of said predetermined contact pattern, and a metal film deposited uniformly over said etched cap layer to provide a Schottky barrier noninjecting contact pattern over etched areas, and injecting contact areas over nonetched areas.

4. A broad area semiconductor laser as defined in claim 3 wherein said fractional coverage per unit area of injecting contact relative to noninjecting contact varies from a minimum at one side to a maximum at the other in a dimension perpendicular to the axis of said broad area semiconductor laser.

* * * * *